United States Patent
McHatet

(10) Patent No.: US 9,913,388 B1
(45) Date of Patent: Mar. 6, 2018

(54) UNIVERSAL MAGNETIC MOUNTING ASSEMBLY

(71) Applicant: Hamid McHatet, Miami, FL (US)

(72) Inventor: Hamid McHatet, Miami, FL (US)

(*) Notice: Subject to any disclaimer, the term of this patent is extended or adjusted under 35 U.S.C. 154(b) by 0 days.

(21) Appl. No.: 15/280,507

(22) Filed: Sep. 29, 2016

(51) Int. Cl.
*H05K 5/02* (2006.01)
*H05K 5/03* (2006.01)
*H05K 5/04* (2006.01)
*H01F 7/02* (2006.01)

(52) U.S. Cl.
CPC ......... *H05K 5/0204* (2013.01); *H01F 7/0252* (2013.01); *H05K 5/03* (2013.01); *H05K 5/04* (2013.01)

(58) Field of Classification Search
USPC ........................................................ 361/807
See application file for complete search history.

(56) References Cited

U.S. PATENT DOCUMENTS

| | | | |
|---|---|---|---|
| 7,909,521 B2* | 3/2011 | Son | G03B 17/00 248/181.1 |
| 8,238,086 B2* | 8/2012 | Ou | F16M 11/10 361/679.21 |
| 8,706,175 B2* | 4/2014 | Cho | F16M 11/041 248/205.1 |
| 9,019,698 B2* | 4/2015 | Thiers | H04W 88/02 248/922 |
| 9,379,759 B2 | 6/2016 | Platt | |
| 9,397,719 B1* | 7/2016 | Schmidt | F16M 11/24 |
| 9,557,002 B2* | 1/2017 | Wong | F16M 11/041 |
| 9,608,366 B2* | 3/2017 | Vroom | H01R 13/6205 |
| 9,747,823 B2* | 8/2017 | Lorenzini | G09F 15/0062 |
| 2011/0192857 A1* | 8/2011 | Rothbaum | B25F 1/00 220/694 |
| 2011/0252607 A1* | 10/2011 | Rothbaum | B65H 75/285 24/303 |
| 2012/0273630 A1* | 11/2012 | Gillespie-Brown | F16M 11/041 248/122.1 |
| 2012/0305733 A1* | 12/2012 | Vogel | F16M 11/14 248/371 |
| 2013/0038989 A1* | 2/2013 | Chang | H05K 5/0204 361/679.01 |

(Continued)

FOREIGN PATENT DOCUMENTS

KR  100381405 A  9/2002

*Primary Examiner* — Binh Tran
*Assistant Examiner* — Douglas Burtner
(74) *Attorney, Agent, or Firm* — Albert Bordas, P.A.

(57) ABSTRACT

A universal magnetic mounting assembly having a case assembly with a hole that has a first circumference, and a rear wall, first and second lateral walls, and top and bottom walls. The rear wall has interior and exterior faces. The case assembly cradles an electronic device. A magnet has an interior wall, a perimeter edge having a second circumference, an exterior wall, an angled wall, and an interior edge. The angled wall is concavely shaped and extends from the exterior wall to the interior edge. The magnet protrudes through the hole, whereby the first circumference is larger than the second circumference. A cover plate has a third circumference larger than the first circumference and is ferromagnetic and/or metallic. The cover plate is positioned between the electronic device and the interior face of the rear wall. Further having a mounting device with a base and a spherically shaped metallic surface.

16 Claims, 4 Drawing Sheets

(56) References Cited

U.S. PATENT DOCUMENTS

| | | | |
|---|---|---|---|
| 2013/0078855 A1* | 3/2013 | Hornick | H01R 13/73 439/571 |
| 2013/0313388 A1* | 11/2013 | Diatzikis | F16B 47/00 248/205.6 |
| 2014/0287801 A1 | 9/2014 | Ho | |
| 2015/0163938 A1* | 6/2015 | Vroom | H01R 13/6205 361/807 |
| 2016/0020810 A1* | 1/2016 | Platt | H04B 1/3888 455/556.1 |
| 2016/0037665 A1* | 2/2016 | Zhang | F16M 11/10 361/807 |
| 2016/0049981 A1 | 2/2016 | Jen et al. | |
| 2016/0068117 A1* | 3/2016 | Huelke | H01F 7/0252 24/303 |
| 2016/0125988 A1* | 5/2016 | Lee | H01F 7/021 361/807 |
| 2016/0150861 A1* | 6/2016 | Yao | A45C 11/00 224/245 |
| 2017/0162312 A1* | 6/2017 | Chaizy | H01F 7/0252 |

* cited by examiner

UNIVERSAL MAGNETIC MOUNTING ASSEMBLY

BACKGROUND OF THE INVENTION

1. Field of the Invention

The present invention relates to accessories for electronics, and more particularly, to universal magnetic mounting assemblies.

2. Other Related Applications

The present application is a continuation-in-part of pending U.S. patent application Ser. No. 14/995,530, filed on Jan. 14, 2016, which is hereby incorporated by reference.

3. Description of the Related Art

Applicant believes that one of the closest references corresponds to U.S. Patent Application Publication No. 20160150861 A1, published on Jun. 2, 2016 to Cheng-Wei YAO for a mountable case assembly. However, it differs from the present invention because YAO teaches a mountable case assembly for protecting and securing a portable electronic device. The mountable case assembly includes a mountable case to receive the portable electronic device. The mountable case assembly includes one or more coupling components for detachably coupling a mountable case with a mounting plate. The mounting case and the mounting plate can be physically coupled and/or magnetically coupled. The mounting case is detachably coupled to a hinge assembly. The hinge assembly is detachably coupled to a wall mount, which can be coupled to a flat surface.

Applicant believes that another reference corresponds to U.S. Patent Application Publication No. 20160049981 A1, published on Feb. 18, 2016 to Tsu-Yin Jen, et al. for a protection device capable of rotatably supporting a portable electronic device. However, it differs from the present invention because Jen, et al. teaches a protection device for rotatably supporting a portable electronic device that includes a cover, a holder and a transmission cable. The holder has a first surface and a second surface opposite to each other. A sunken slot is formed on the first surface, which supports the portable electronic device. A hole structure of the holder is connected to the sunken slot and formed between the first surface and the second surface, and an arc structure is disposed on the second surface to rotatably assemble with a rotary portion of the cover. A section of the transmission cable is connected to a first connector to be disposed inside the sunken slot, another section of cable is connected to a second connector to be embedded into the cover, and a middle section of the cable pierces through the hole structure to electrically connect the first connector with the second connector.

Applicant believes that another reference corresponds to U.S. Patent Application Publication No. 20160020810 A1, published on Jan. 21, 2016 to Ryan Platt for a magnetic case for an electronic device. However, it differs from the present invention because Platt teaches a case for an electronic device having a front face, a rear face, a top edge, a bottom edge, and two side edges. The case includes a body, a metal tab, one or more permanent magnets and one or more removable magnets. The body covers at least a portion of the rear face of the electronic device, and has several fastening portions configured to fasten the mobile device to the case. The metal tab is insertable through a slot in the body to rest between the body and the electronic device when inserted through the slot. The one or more permanent magnets that are permanently attached to the body. At least one removable magnet is configured to attach by a magnetic force to the metal tab when the metal tab is inserted into the slot, thereby holding the removable magnet in place with respect to the body.

Applicant believes that another reference corresponds to U.S. Patent Application Publication No. 20140287801 A1, published on Sep. 25, 2014 to Chih Feng HO for a protective shell and charging device assembly for mobile phone. However, it differs from the present invention because HO teaches a protective shell and charging device assembly that includes a shell having a base member for attaching to an electrical facility, an attaching device attached to the base member of the shell, a charging device, and another attaching device attached to the charging device for slidably engaging with the attaching device of the base member and for detachably attaching the charging device to the shell. The attaching devices include one or more magnetic attractive members for attracting or acting with each other and for detachably attaching the charging device to the shell. The shell includes a compartment formed by the base member, an upper member and a lower member for engaging with the mobile phone.

Applicant believes that another reference corresponds to U.S. Pat. No. 9,397,719 B1 issued to Steve Schmidt on Jul. 19, 2016 for a mobile device holder. However, it differs from the present invention because Schmidt teaches a two-piece mobile device holder having a case assembly and a mounting assembly. The case assembly is configured to receive and secure a mobile device such as a smart phone. The mounting assembly is configured to be detachably coupled to other objects. Sets of permanent magnets are arranged in a circular pattern in the case assembly and the mounting assembly. The magnets in both the first and second set of magnets are arranged with alternating magnetic polarity. As the case assembly is placed on top of the mounting assembly, the magnets in the mounting assembly will attract magnets with opposite polarities in the case assembly. A user may detach the case assembly from the mounting assembly by rotating the case assembly such that the magnets in the case assembly are now adjacent to magnets in the mounting assembly of the same polarity.

Applicant believes that another reference corresponds to U.S. Pat. No. 9,379,759 B2 issued to Ryan Platt on Jun. 28, 2016 for a magnetic case for an electronic device. However, it differs from the present invention because Platt teaches a case for an electronic device having a front face, a rear face, a top edge, a bottom edge, and two side edges. The case includes a body, a metal tab, one or more permanent magnets and one or more removable magnets. The body covers at least a portion of the rear face of the electronic device, and has several fastening portions configured to fasten the mobile device to the case. The metal tab is insertable through a slot in the body to rest between the body and the electronic device when inserted through the slot. One or more permanent magnets are permanently attached to the body. At least one removable magnet is configured to attach by a magnetic force to the metal tab when the metal tab is inserted into the slot, thereby holding the removable magnet in place with respect to the body.

Applicant believes that another reference corresponds to U.S. Pat. No. 9,019,698 B2 issued to Jean-Michel Thiers on Apr. 28, 2015 for a mounting system for electronic device. However, it differs from the present invention because Thiers teaches a mounting system for an electronic device that includes a dock interface assembly and a case assembly. The dock interface assembly includes a dock housing having one or more contacts. The case assembly may include an alignment feature and a case printed circuit board having one or more conductive traces corresponding to the contacts. The dock interface assembly and/or the case assembly may have a metallic element configured complementary to one or more magnets provided with a remaining one of the dock interface assembly and the case assembly for magnetic coupling of the case assembly to the dock interface assembly. The dock housing is configured to be received by the alignment feature such that at least one of the contacts is electrically coupled to a corresponding one of the conductive traces.

Applicant believes that another reference corresponds to U.S. Pat. No. 8,706,175 B2 issued to Richard Cho on Apr. 22, 2014 for a phone and tablet stand. However, it differs from the present invention because Cho teaches a phone and tablet stand that includes a rotatable mounting head that attaches a tablet to the phone and tablet stand, attachment magnets that are evenly disposed on a rotatable mounting head to magnetically attach a tablet to the phone and tablet stand and an adjustable stand that includes a stem and a pair of adjustment knobs. The phone and tablet stand also includes a base that provides stability to the phone and tablet stand and a gel attachment interface that is in direct contact with a contact surface where the phone and tablet stand is removably secured. The phone and tablet stand can also include a protective casing that is placed around the back of a tablet and is magnetically attached to the phone and tablet stand and includes a metal disc disposed and centered on the front facing of the protective casing.

Applicant believes that another reference corresponds to Korean Patent No. 100381405 A issued to Song Jae Ho on Sep. 5, 2002 for Portable Phone Cradle. However, it differs from the present invention because Ho teaches a portable phone cradle to semi-permanently mount a magnet by improving a structure to fix the magnet, comprising: A cradle main body in a portable phone divided into a front case and a rear case. Also the main body is composed of a magnet-mounting slot, a fixing unit, and a magnet-exposing hole. The magnet-mounting slot is formed inside the front case so that a magnet can be installed in the inside of the front case. The fixing unit, composed of a plurality of fixing ribs formed in the rear case, fixes and supports the magnet installed in the front case. The magnet-exposing hole is formed at the front case so as to strengthen the force of the magnet and to transfer this force to the portable phone.

Other patents describing the closest subject matter provide for a number of more or less complicated features that fail to solve the problem in an efficient and economical way. None of these patents suggest the novel features of the present invention.

SUMMARY OF THE INVENTION

The present invention is a universal magnetic mounting assembly, comprising a case assembly having a hole with a first circumference. The case assembly further comprises a rear wall, first and second lateral walls, and top and bottom walls. The rear wall comprises interior and exterior faces. In a preferred embodiment, the case assembly cradles an electronic device such as, but not limited to, a computer, smart phone, hand-held computer, personal digital assistant, electronic organizer, electronic notepad, computer peripheral and/or accessory, digital electronic device, or consumer electronic device.

A magnet comprises an interior wall, a perimeter edge having a second circumference, an exterior wall, an angled wall, and an interior edge. The interior wall is flat. The perimeter edge and the interior edge are approximately perpendicular to the interior wall. The exterior wall is approximately perpendicular to the perimeter edge. The angled wall is concavely shaped and extends from the exterior wall to the interior edge. The magnet protrudes through the hole, whereby the first circumference is larger than the second circumference.

Further comprising a cover plate. The cover plate has a third circumference larger than the first circumference and is ferromagnetic and/or metallic. The cover plate is flat. The cover plate is positioned between the electronic device and the interior face of the rear wall.

Further comprising a mounting device comprising a base and a metallic surface. The metallic surface is spherically shaped.

It is therefore one of the main objects of the present invention to provide a universal magnetic mounting assembly.

It is another object of this invention to provide a universal magnetic mounting assembly that may be utilized with any electronic device cover or case.

It is another object of this invention to provide a universal magnetic mounting assembly that may be detachably secured onto a mounting device.

It is another object of this invention to provide a universal magnetic mounting assembly that is volumetrically efficient for carrying, transporting, and storage.

It is another object of this invention to provide a universal magnetic mounting assembly that can be readily assembled and disassembled without the need of any special tools.

It is another object of this invention to provide a universal magnetic mounting assembly, which is of a durable and reliable construction.

It is yet another object of this invention to provide such a device that is inexpensive to manufacture and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE PREFERRED EMBODIMENT

Figure 1:
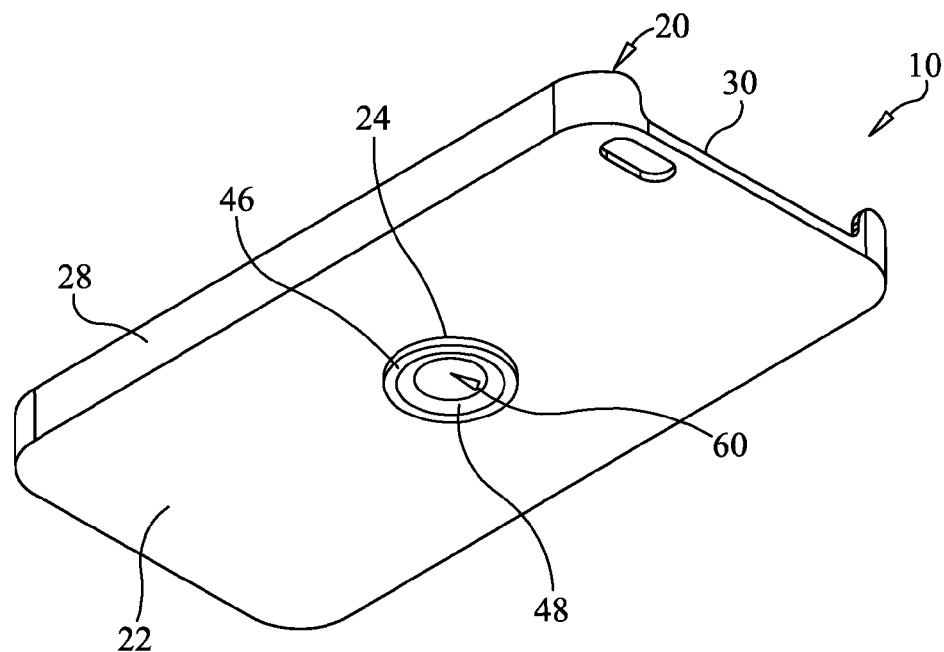
FIG. 1 represents a first isometric view of the present invention.

Referring now to the drawings, the present invention is a universal magnetic mounting assembly and is generally referred to with numeral 10. It can be observed that it basically includes case assembly 20, magnet 40, cover plate 60, and mounting device 80.

Figure 2:
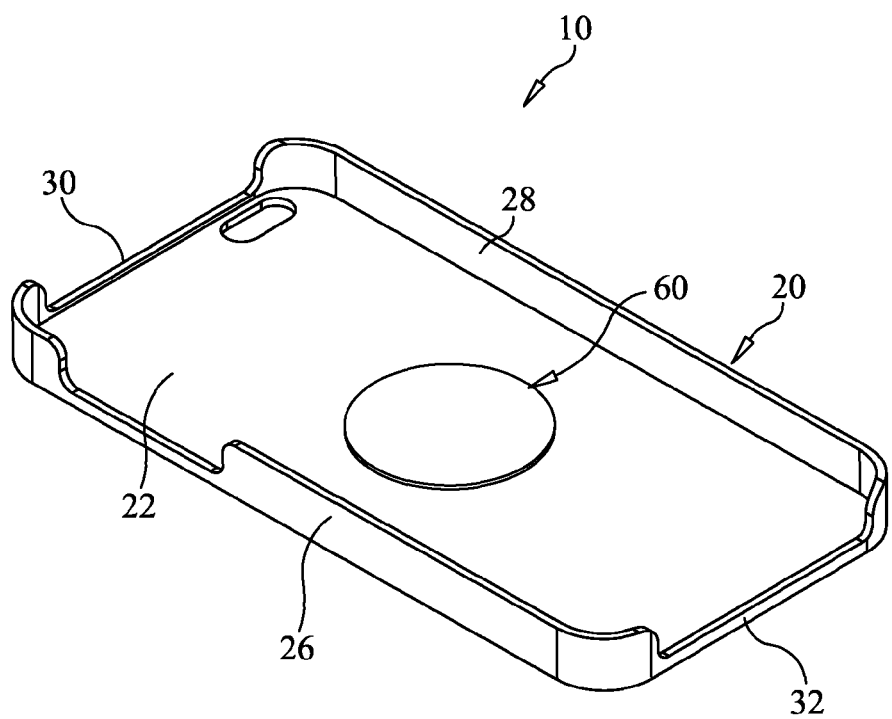
FIG. 2 represents a second isometric view of the present invention.

As seen in FIGS. 1 and 2, case assembly 20 comprises rear wall 22, first and second lateral walls 26 and 28 respectively, and top and bottom walls 30 and 32 respectively. Rear wall 22 comprises interior and exterior faces. Case assembly 20 further comprises hole 24 with a first circumference.

Figure 3:
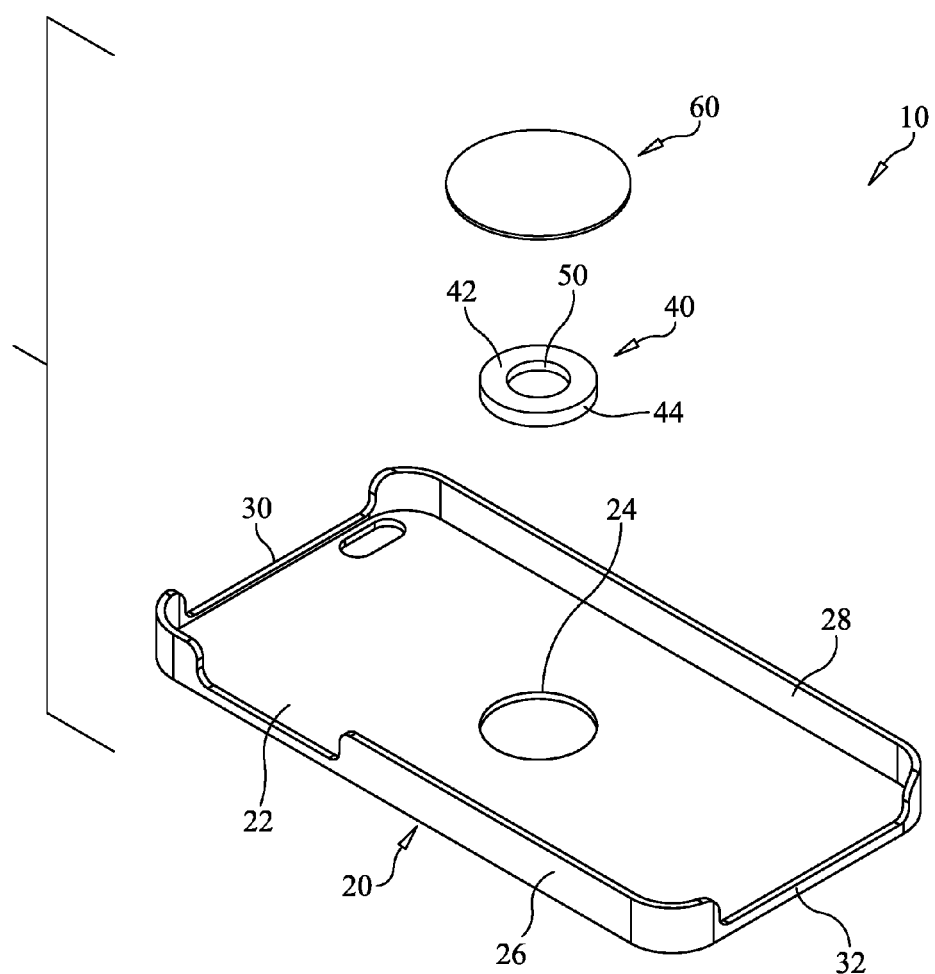
FIG. 3 represents a first isometric exploded view of the present invention.
Figure 4:
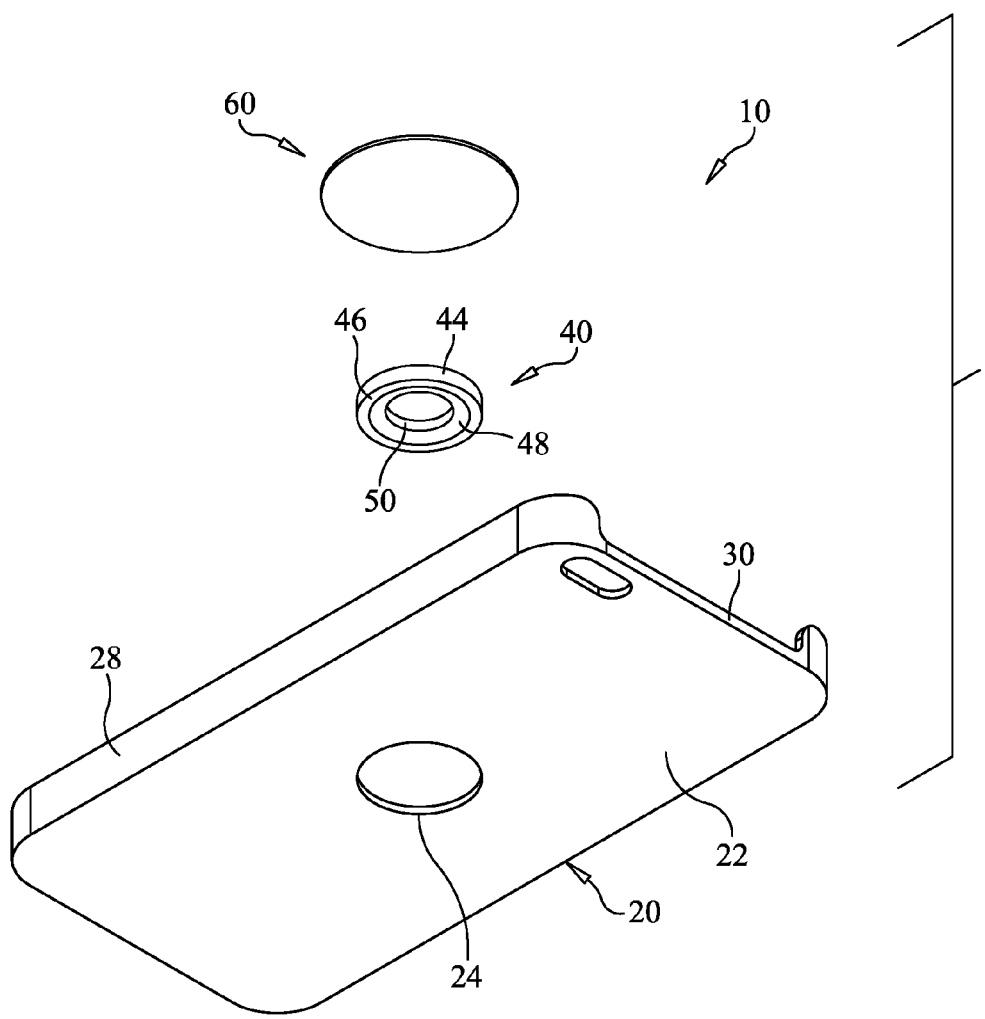
FIG. 4 represents a second isometric exploded view of the present invention.

As seen in FIGS. 3 and 4, magnet 40 comprises interior wall 42, perimeter edge 44 having a second circumference, exterior wall 46, angled wall 48, and interior edge 50. In a preferred embodiment, interior wall 42 is flat. Perimeter edge 44 and interior edge 50 are approximately perpendicular to interior wall 42. Exterior wall 46 is approximately perpendicular to perimeter edge 44. Angled wall 48 is concavely shaped and extends from exterior wall 46 to interior edge 50.

Cover plate 60 has a third circumference that is larger than the first circumference and is ferromagnetic or metallic. In a preferred embodiment, cover plate 60 is flat and is positioned between electronic device 70, seen in FIGS. 5 and 6, and the interior face of rear wall 22 seen in FIG. 2.

Figure 5:
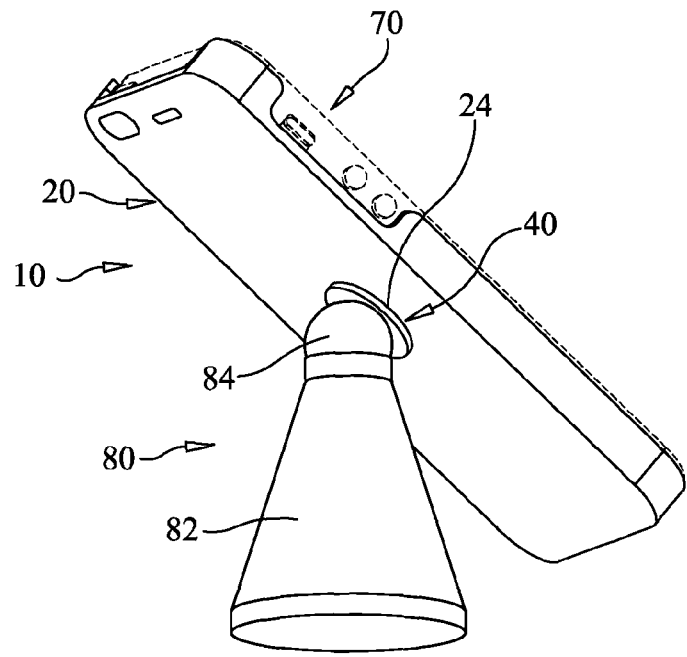
FIG. 5 represents a first isometric view of the present invention mounted onto a mounting device and cradling an electronic device.
Figure 6:
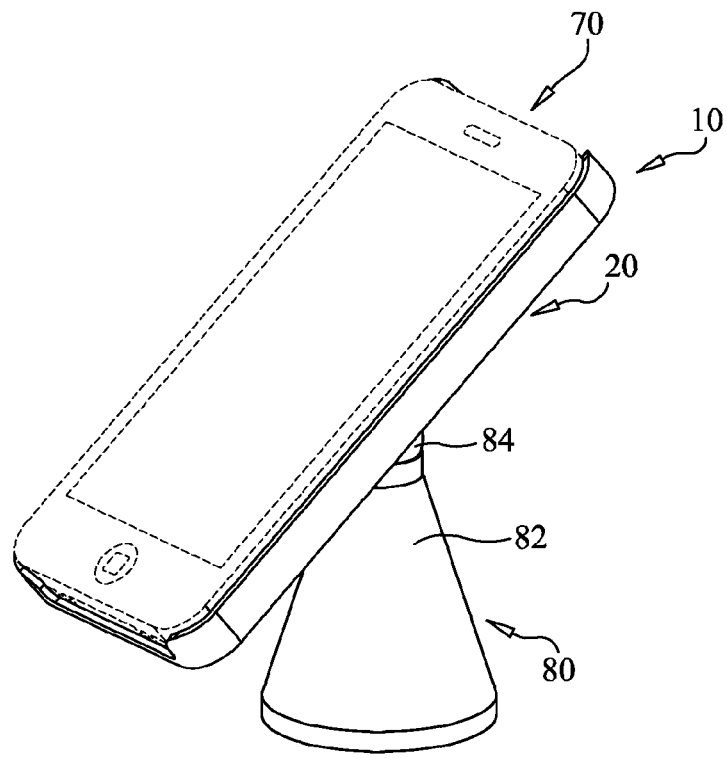
FIG. 6 represents a second isometric view of the present invention mounted onto the mounting device and cradling the electronic device.

As seen in FIGS. 5 and 6, present invention 10 further comprises mounting device 80 comprising base 82 and metallic surface 84. In a preferred embodiment, metallic surface 84 is spherically shaped. In a preferred embodiment, case assembly 20 cradles electronic device 70 which is as an example, but not limited to, a computer, smart phone, hand-held computer, personal digital assistant, electronic organizer, electronic notepad, computer peripheral and/or accessory, digital electronic device, or consumer electronic device. Magnet 40 protrudes through hole 24, whereby the first circumference is larger than the second circumference, enabling angled wall 48 to rotate upon metallic surface 84. It is noted that a magnetic force keeps magnet 40 biased against cover plate 60.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A universal magnetic mounting assembly, comprising:
   A) a case assembly comprising a hole having a first circumference;
   B) a magnet comprising an interior wall, a perimeter edge having a second circumference, an exterior wall, an angled wall, and an interior edge, said magnet protrudes through said hole whereby said first circumference is larger than said second circumference, said angled wall extends from said exterior wall to said interior edge; and
   C) a cover plate.

2. The universal magnetic mounting assembly set forth in claim 1, further characterized in that said case assembly further comprises a rear wall, first and second lateral walls, and top and bottom walls.

3. The universal magnetic mounting assembly set forth in claim 2, further characterized in that said rear wall comprises interior and exterior faces.

4. The universal magnetic mounting assembly set forth in claim 3, further characterized in that said case assembly cradles an electronic device.

5. The universal magnetic mounting assembly set forth in claim 1, further characterized in that said interior wall is flat.

6. The universal magnetic mounting assembly set forth in claim 1, further characterized in that said perimeter edge and said interior edge are approximately perpendicular to said interior wall.

7. The universal magnetic mounting assembly set forth in claim 1, further characterized in that said exterior wall is approximately perpendicular to said perimeter edge.

8. The universal magnetic mounting assembly set forth in claim 1, further characterized in that said angled wall is concavely shaped.

9. The universal magnetic mounting assembly set forth in claim 1, further characterized in that said cover plate has a third circumference larger than said first circumference.

10. The universal magnetic mounting assembly set forth in claim 1, further characterized in that said cover plate is ferromagnetic.

11. The universal magnetic mounting assembly set forth in claim 1, further characterized in that said cover plate is metallic.

12. The universal magnetic mounting assembly set forth in claim 1, further characterized in that said cover plate is flat.

13. The universal magnetic mounting assembly set forth in claim 3, further characterized in that said cover plate is positioned between said electronic device and said interior face of said rear wall.

14. The universal magnetic mounting assembly set forth in claim 1, further comprising a mounting device comprising a base and a metallic surface.

15. The universal magnetic mounting assembly set forth in claim 14, further characterized in that said metallic surface is spherically shaped.

16. The universal magnetic mounting assembly set forth in claim 4, further characterized in that said electronic device is a computer, smart phone, hand-held computer, personal digital assistant, electronic organizer, electronic notepad, computer peripheral and/or accessory, digital electronic device, or consumer electronic device.

* * * * *